Nov. 17, 1959 H. J. WOLL 2,913,539

WIDE BAND SIGNAL AMPLIFIER CIRCUIT

Filed Oct. 2, 1953 3 Sheets-Sheet 1

INVENTOR.
Harry J. Woll

BY H. C. Newton

ATTORNEY

INVENTOR.
Harry J. Woll
BY H. O. Newton
ATTORNEY

WIDE BAND SIGNAL AMPLIFIER CIRCUIT

Filed Oct. 2, 1953 3 Sheets-Sheet 3

INVENTOR.
Harry J. Woll
BY H. C. Newton
ATTORNEY

United States Patent Office 2,913,539
Patented Nov. 17, 1959

2,913,539

WIDE BAND SIGNAL AMPLIFIER CIRCUIT

Harry J. Woll, Audubon, N.J., assignor to Radio Corporation of America, a corporation of Delaware Application October 2, 1953, Serial No. 383,795
5 Claims. (Cl. 179—171)

This invention relates to electric signal amplifier circuits and more particularly to wide band signal amplifiers for television video signal amplification and the like.

In conventional wide-band amplifiers the gain per stage is limited by the transconductance of the tube and the interstage capacities. For extended or large bandwidths, the stage gain may be less than unity, hence, amplification cannot be obtained.

One cannot alleviate this difficulty by reducing the bandwidth until the stage gain is greater than unity, and then stagger tuning a multiplicity of such stages, because a given stage will actually attenuate signal frequencies that are being amplified by the next stage.

Various amplifier systems for avoiding this difficulty have been proposed, such as a parallel amplifier as disclosed in British Patent 448,113 or the MIT Quarterly Progress Report for July 15, 1951, page 47, and a distributed amplifier as disclosed in British Patent 460,562 and in the Proceeding of the IRE Volume 36, pp. 956–959, August, 1948.

A parallel amplifier divides the band of frequencies to be amplified into a number of sub-bands that are narrow enough to be amplified conventionally. The incoming signal is divided by filters into sub-bands which are amplified and finally combined into one signal. The major difficulty with this system is that of matching at the crossover points. At certain frequencies the signal reaches the output via two paths. In order to have these two signals add up to the original signal, the phase and amplitude characteristics of the two paths must be carefully designed and rigidly controlled. An error in phase can result in cancellation of voltages, and hence a loss in amplification at particular frequencies.

It is an object of this invention, therefore, to provide a signal amplifier system having wide bandwidth amplification and, at the same time, preventing phase shift in matching sub-bands at the crossover points.

The distributed amplifier separates the input capacities of a number of parallel tubes by means of inductances, creating an artificial transmission line. Another similar line is formed with the plate circuits. If velocity of propagation down these two lines is the same, the signal outputs of the paralleled tubes will add and overall gain can be obtained even though the gain of each tube is less than unity.

It is a further object of this invention to provide an improved signal amplifier which may operate with at least unity gain for each stage of amplification for all signal frequencies over a certain wide range.

It is also a further object of this invention to provide an improved amplifier circuit which permits relatively wide bandwidth operation and relatively high gain amplification.

It is a further object of this invention to provide an electronic tube wide band-pass filter system in which the tube constants are used as a part of the filter system.

The wide band signal amplifier provided in accordance with the present invention is neither of the parallel or of the distributed type but may be termed an all-pass type in that it comprises amplifier stages, that may be used singly or in cascade connection, each one of which amplifies a certain band of signal frequencies without attenuating signals at frequencies outside that band. Thus an amplifier embodying the invention may include a single stage or a number of stages in cascade. Each stage may have a frequency band in which normal amplification takes place. Outside this band the gain is a minimum of unity instead of falling off rapidly as in a conventional amplifier. Since the stage gain does not drop below unity for the range of operating frequencies, a number of stages may be cascaded without the bandwidth shrinkage that takes place in the conventional stagger-tuned amplifier. However, the overall response curve may be synthesized in a manner similar to that used with conventional stagger-tuned amplifiers. Each stage contributes to the overall amplification in its band of normal amplification and does not attenuate the signal outside its normal band.

The invention will further be understood from the following description when considered with reference to the accompanying drawings, and its scope is pointed out in the appended claims.

Generally, the all-pass amplifier stage comprises a network in which the input impedance and the load circuit are resistive and independent of frequency. While such a resistive input impedance or load are not essential to the principle of "all-pass" amplifier operation, the design of such an amplifier is considerably simplified, since the voltage transfer ratio is then the only factor that enters into response calculations of a multi-stage amplifier. An all-pass amplifier network may be attained, for example, when the input and load impedances are resistive and the transfer impedance conforms to the following formula:

$$Z_T = R\frac{p-\omega_0}{p+\frac{\omega_0}{A}}$$

or its band pass equivalent, $$Z_T = R\frac{p+\frac{\omega_1^2}{p}-\omega_0}{p+\frac{\omega_1^2}{p}+\frac{\omega_0}{A}}$$

where $p$ is the complex frequency variable and equal to $j2\pi f$, $j$ being the imaginary term of the complex notation, R is the load resistance, A is the maximum stage voltage gain, $\omega_0$ is a measure of bandwidth and $\omega_1$ is the angular frequency of maximum gain. In this application A will be referred to as stage gain.

Figure 10:
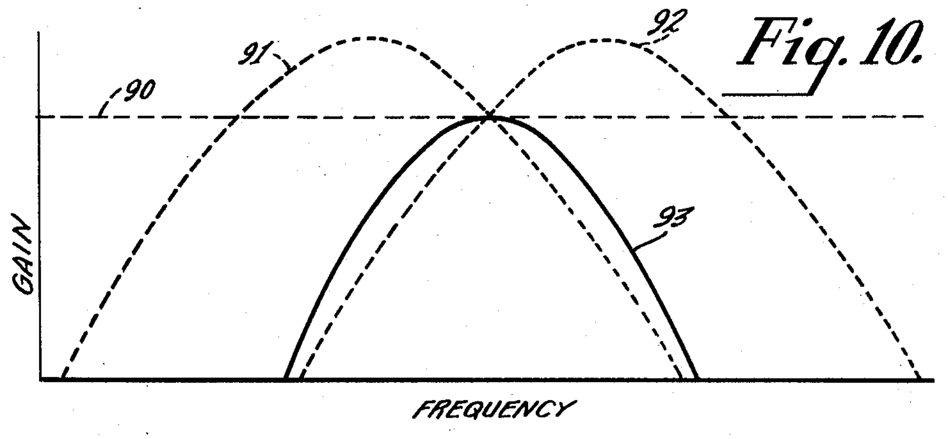
Figure 10 is a further graph showing curves illustrating the general frequency characteristics of conventional amplifying systems.

Referring to the drawings and with particular reference to Figure 10, the general frequency response characteristic of a conventional amplifying system, such as one employing stagger tuning is shown with respect to gain. The dotted line 90 represents unity gain. The dotted curve 91 illustrates the response characteristic of a conventional amplifier stage tuned to the low end of a frequency band. The dotted curve 92 is a similar response characteristic of a second conventional amplifier stage cascade connected with the first and tuned to the high end of a frequency band. The resultant output characteristic of the two stages is illustrated by the response curve 93, when the output signals are combined in the manner usually employed in stagger-tuned systems. It is seen from the curve 93 that if the bandwidth is large, a given stage of a conventional amplifier will not only fail to amplify signals at frequencies which have been amplified by a previous stage, but will actually attenuate these signals.

Figure 11:
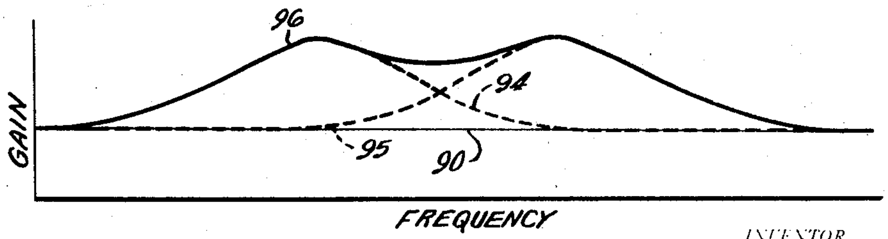
Figure 11 is a graph showing curves illustrating the general frequency response characteristics of an all-pass amplifier embodying the present invention.

Referring to Figure 11 along with Figure 10, the general frequency response characteristics with respect to gain of an all-pass amplifier embodying the present invention are shown. As in Figure 10, the line 90 represents unity gain. The dotted characteristic curve 94 represents the gain of one stage of the all-pass amplifying system which is tuned to the low end of the frequency band and 95 represents the gain of a stage tuned to high end. Each of the two stages in this figure is tuned to the same frequency as the two stages previously mentioned in connection with Figure 10. The combined output from the two stages of the all-pass amplifying system embodying the invention is illustrated by the characteristic curve 96.

It is seen that although each stage of the all-pass amplifier amplifies signals in a band of frequencies, all signals at frequencies outside the band are still transmitted without attenuation.

Figure 1:
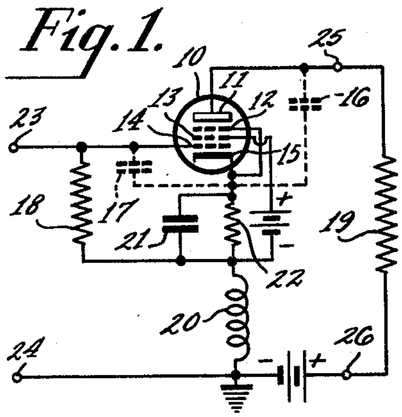
Figure 1 is a schematic circuit diagram of an all-pass signal amplifier stage embodying the invention.

Referring to Figure 1 an all-pass amplifier stage includes a pentode 10 connected as a low frequency amplifier which at the same time, permits higher frequency signals to pass without attenuation. The amplifier stage is provided with a pair of signal input terminals 23 and 24 and a pair of signal output terminals 25 and 26. The latter are connected to a resistive load represented by a resistor 19. The plate or anode 11 and the screen grid 13 are connected to a positive source of operating potential as shown. The suppressor grid 12 is connected to the cathode or electron emitter 15 in a conventional manner. Resistor 22 provides the operating bias for the tube and is shunted by a by-pass capacitor 21. The grid-to-cathode capacitance is indicated by a capacitor 17. The plate-to-cathode capacitance is indicated by a capacitor 16. A point of common reference potential between the signal input and output circuits is represented by a ground connection.

The input voltage is impressed across an input circuit load resistor 18 in parallel with the capacitance 17, and an inductor 20 connected in the cathode circuit between the resistor 22 and ground, and effectively between the cathode and ground for signal frequencies. At low frequencies the cathode-to-ground impedance is small since the reactance of the inductor 20 is negligible at those frequencies. The inter-electrodal capacitances 16 and 17 have negligible effect at low frequencies thereby permitting the tube 10 to amplify in a conventional manner. At relatively high frequencies, the tube capacitances 16 and 17 offer low impedances while the cathode-to-ground inductance of inductor 20 offers a relatively high impedance to the signal currents. The input current, therefore, flows directly into the load resistor 19 through the inter-electrodal capacitances 16 and 17.

This all-pass amplifier stage may be considered a combined conventional amplifier stage and a high-pass filter, formed of series reactive elements (here the interelectrode capacitances of the tube 10) and parallel reactive elements complementary to the series reacting elements (here the inductor 20), with each performing its characteristic function over a portion of the frequency spectrum. However, in order for all the frequencies within a desired range to pass without attenuation, the values of the elements involved must be within a certain range of values.

The values of the elements to be used in one embodiment of this circuit may be determined mathematically by the use of the following formulas.

The input impedance is resistive at all frequencies if:

$$g_m R = \frac{C_1}{C_2}$$

$$L = \frac{R_2 C_1}{1 + g_m R}$$

where R is the value of the load resistor 19, $C_1$ is the grid to cathode capacitance 17, $C_2$ is the plate-cathode capacitance 16, L is the inductance of the inductor 20 and $g_m$ is the transconductance of the tube.

When the above formulas are satisfied the transfer impedance is then:

$$Z_T = \frac{E_3}{I_1} = R\frac{pRC_2 - 1}{pRC_2 + \frac{1}{g_m R}}$$

or the voltage gain:

$$\frac{E_3}{E_1} = \frac{pRC_2 - 1}{pRC_2 + \frac{1}{g_m R}}$$

where $E_3$ is the voltage across the terminals 25 and 26, and the input impedance is resistive and equal to R at all frequencies, $E_1$ is the voltage across the terminals 23 and 24, $I_1$ is the current at terminal 23 and $p$ is equal to $j2\pi f$.

The solution of these mathematical formulas indicate that the gain of the amplifier stage is greater than one at all frequencies for the circuit shown in Figure 1.

As used throughout the specification, all-pass amplifier stages which have their maximum gain at zero frequency will be referred to as low-pass stages, and all other amplifier stages will be referred to as band-pass stages.

The low-pass amplifier illustrated in Figure 1 may be transformed into a band-pass amplifier if desired by the conventional technique of adding a parallel inductance to resonate each capacitor and a series capacitor to resonate each inductance at the frequency which is to have maximum gain. Such a technique is hereinafter shown and described in connection with Figure 5.

Figure 2:
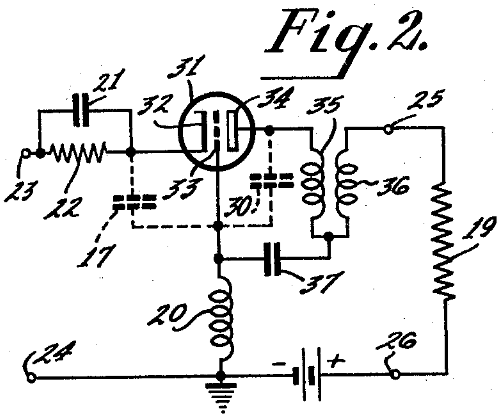
Figure 2 is a schematic circuit diagram of an all-pass signal amplifier stage, embodying the invention, being a modified form of the circuit of Figure 1.

In Figure 2 of the drawing a cathode input all-pass amplifier stage, comprising an electron tube 31 having an anode 34, control element or grid 33, and cathode 31. The tube 31 is provided with a pair of input terminals 23 and 24 and output terminals 25 and 26 are connected to a substantially resistive load such as a resistor 19. A capacitor 30 represents the plate-grid capacitance of the electron tube triode 31. The anode or plate 34 is connected to a conventional source of operating potential through a primary winding 35 and a secondary winding 36 of a transformer and the load resistance 19. A bypass capacitor 37 connects the transformer 35, 36 to the grid 33 at signal frequencies. Cathode resistor 22 is bypassed by a capacitor 21, and provides the operating bias for the tube. A reactive element complementary to the capacitive reactance of the interelectrode capacitances 17 and 30, such as an inductor 20, is connected between the grid 33 and ground. At low frequencies, the interelectrodal capacitances 17 and 30 have negligible effect since they are high impedances at low frequencies. Since the inductance of the coil 20 offers low impedance, the triode tube amplifies the signal voltage in a conventional manner. The signal output voltage from the plate of the triode is developed across the primary winding 35 and inductively coupled to the secondary winding 36 across the resistive load 19. A direct current return between the terminals 23—24 may be through a source of signal voltage not shown. At relatively high frequencies the interelectrode capacitances 17 and 30 offer a low impedance, while the inductor 20 connected between the grid and the input terminal 24 offers a high impedance. The signal current, therefore, flows directly to the load resistance 19 through the tube capacities and the secondary winding 36. It should be noted that the grid-to-plate capacitance 30 short circuits the primary winding 35 at high frequencies. Such a short circuit across the primary winding effectively short circuits the secondary winding 36 so as to permit the signal current to pass directly to the load resistance, as heretofore mentioned.

All frequencies within a desired range pass without attenuation when the values of the circuit constants are within the certain limits determined by mathematical formulas which follow. The input impedance is resistive at all frequencies if:

$$n^3=\frac{C_1}{C_2}$$

$$L=\frac{C_1}{(n+1)g_m^2}$$

$$R=\frac{1}{g_m}$$

where $n$ is the ratio of turns between the primary and secondary windings of the transformer: $C_1$ is the grid-cathode capacitance 17, $C_2$ is the plate-grid capacitance 30, L is the inductance of the coil 20, R is the resistive load 19 and $g_m$ is the transconductance of the tube 31. When the above formulas are satisfied, the transfer impedance then reduces to:

$$\frac{E_3}{I_1}=R\frac{pC_1-ng_m}{pC_1+g_m} \text{ or } \frac{E_3}{E_1}=\frac{pC_1-ng_m}{pC_1+g_m}$$

where $E_3$ is the voltage across the terminals 25 and 26, and $E_1$ is the voltage across the terminals 23 and 24. $I_1$ is the current at terminal 23 and $p$ is equal to $j2\pi f$.

As in Figure 1, the low pass amplifier illustrated in Figure 2 may be transferred into a band pass amplifier by the conventional technique of adding a parallel inductance to resonate each capacitor and a series capacitor to resonate each inductance at the frequency which is chosen to give maximum gain.

Figure 3:
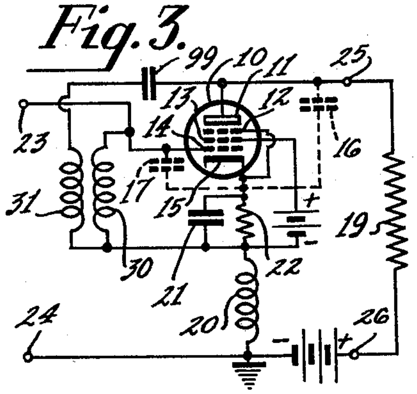
Figures 3, 4, 5 and 6 are schematic circuit diagrams of all-pass amplifiers embodying the invention, being further modifications of the circuit of Figure 1.

In Figure 3 of the drawing, an all-pass amplifier stage in accordance with the invention and having transformer feedback, comprises a pentode 10 having its plate 11 and its screen grid 13 connected to a source of positive operating potential, as indicated. The suppressor grid 12 is connected to the cathode 15 in a conventional manner. The tube 10 is provided with a pair of input terminals 23 and 24 and a pair of output terminals 25 and 26 which are connected across the resistive load represented by a resistor 19. The cathode resistor 22 provides the grid bias for the tube 10 and is shunted by the capacitor 21 to provide an alternating current signal bypass. The grid-to-cathode capacitance is represented by the capacitor 17 and the plate-to-cathode capacitance is represented by the capacitor 16. A transformer having an input winding 30 and an output winding 31 provides a feed-back from the plate output circuit to the grid input circuit. The amount of feedback is such that the input circuit is substantially resistive. A capacitor 99 isolates the signal current from the direct current.

At low frequencies the interelectrode capacitances 16 and 17 have little effect upon the operation of the tube 10, which amplifies in a conventional manner. At relatively high frequencies the interelectrode capacitances 16 and 17 offer low impedance to the flow of signal currents. Since the inductor 20 offers a high impedance to the flow of signal currents at high frequencies, it is seen that the input signal current is directly coupled to the output load resistance 19 through the capacitances 16 and 17.

To operate as an all-pass amplifier the values of the circuit constants are within a certain range of values. In the form of the invention shown in Figure 3, for example, the range of values may be determined by the mathematical formulas which follow:

The input impedance is resistive at all frequencies if:

$$ng_mR=n^2-1$$

and $$\frac{n+1}{R_2}=\frac{n^2C_2+C_1}{(n+1)L}$$

where $n$ is the transformer turns ratio and is equal to the stage gain, R is the resistive load 19, $g_m$ is the transconductance of the tube 10, $C_1$ is the grid to cathode capacitance 17, $C_2$ is the plate-to-cathode capacitance 16.

If both the conditions of the above formulas are met, then:

$$\frac{E_3}{E_1}=\frac{p^R\left(\frac{N^2C_2+C_1}{n+1}\right)-n}{p^R(N^2C_2+C_1)+1}$$

where $E_3$ is the voltage across the output terminal 25 and 26 $E_1$ is the voltage cross the input terminals 23 and 24 and $p$ is equal to $j2\pi f$.

The low-pass amplifier illustrated in Figure 3 is transformed into a band-pass amplifier by the conventional technique of adding parallel inductance elements to resonate each capacitor and a series capacitor to resonate each inductance at the frequency which is to be maximum gain.

If iterative matching is not required, the stage gain-bandwidth product can be increased in some cases. For example, consider the grid-input stage shown in Figure 1. The insertion gain has been shown to be:

$$\frac{E_3}{E_1}=\frac{\frac{p}{\omega_0}-1}{\frac{p}{\omega_0}+\frac{1}{A}}$$

where $$\omega_0=\frac{1}{RC_2}$$

$$A=g_mR=\frac{C_1}{C_2}$$

$$L=\frac{R^2C_1}{1+g_mR}$$

The input impedance is R at all frequencies. If the grid-to-cathode resistance is removed, the low-frequency insertion gain is doubled with no loss at the higher frequencies. The insertion gain and input impedance now are:

$$\frac{E_3}{E_1}=\frac{\left(\frac{p}{\omega_0}\right)^2-\left(1+\frac{1}{A}\right)}{\left(\frac{p}{\omega_0}\right)^3+\left(\frac{p}{\omega_0}\right)^2\left(1+\frac{1}{A}\right)+\left(\frac{p}{\omega_0}\right)\left(1+\frac{1}{A}+\frac{1}{2A^2}\right)+\frac{1}{2A}\left(1+\frac{1}{A}\right)}$$

$$\frac{E_1}{I_1}=R\frac{\left(\frac{p}{\omega_0}\right)^3+\left(\frac{p}{\omega_0}\right)^2\left(1+\frac{1}{A}\right)+\left(\frac{p}{\omega_0}\right)\left(1+\frac{1}{A}+\frac{1}{A^2}\right)+\frac{1}{A}\left(1+\frac{1}{A}\right)}{\left(\frac{p}{\omega_0}\right)^3+\left(\frac{p}{\omega_0}\right)^2\left(1+\frac{1}{A}\right)+\left(\frac{p}{\omega_0}\right)\left(1+\frac{1}{A}\right)}$$

The input impedance is now reactive at low frequencies. The increase in gain is due to the fact that the source is unterminated at low frequencies and the signal level at the grid of the tube is twice what it was in the terminated case.

When the stages are not iteratively matched, the synthesis of a multi-stage amplifier becomes very difficult. Since the stages cannot be considered individually, the expression for overall gain must be considered in polynomial form. In other words, if a change is made in the response of one stage, it changes either the source impedance or the load for each of the other stages.

As discussed hereinbefore the stage gain of a grid input stage, such as the one illustrated in Figure 1, depends upon the capacity ratio of the grid-cathode capacitance to the plate-cathode capacitance. In practical application, it would be inconvenient to have the stage gain depend completely upon such a ratio. Thus, it would be desirable to add a design factor which will enable a manufacturer to produce an all pass amplifier, regardless of the ratio existing between certain tube capacities.

Figure 4:
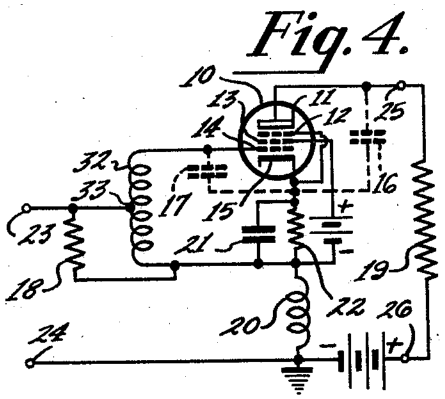

Referring to Figure 4 of the drawing, a circuit substantially similar to the one illustrated in Figure 1 is provided with means whereby the stage gain is not limited to the interelectrode capacitances and includes an ideal auto-transformer 32 which is placed across the grid-cathode capacitance 17. A transformer tap 33 is connected to input terminal 23. An input load resistor 18 is connected from the tap 33 to the low signal potential end of the auto-transformer 32. It is seen that if the step-up ratio of the auto-transformer is equal to "$a$," it effectively increases the input capacity from $C_1$ to $A_2$ $C_1$ and transconductance of the tube is increased from $g_m$ to $ag_m$. The voltage transfer ratio of the stage is now:

$$\frac{E_3}{E_1}=\frac{pRC_2-1}{pRC_2+\frac{1}{ag_mR}}$$

It should be noted that this formula is substantially similar to the formula derived in connection with the circuit shown in Figure 1. In this case, however, the stage gain is equal to $ag_m$R, whereas in Figure 1, the gain stage was equal to $g_m$R.

By avoiding the design limitations resulting from use of specific values of interelectrode capacitance of the tube, a certain amount of flexibility in the design of an all-pass amplifier stage is provided. Thus, an amplifier in accordance with the invention may be manufactured which does not depend on rigid interelectrode capacitance tolerances.

In operation the circuit of Figure 4 is substantially similar to the operation of the circuit described in connection wth Figure 1. Signal input terminals 23 and 24 are connected across the lower portion of the auto-transformer shunted by the input load resistor 18 and the inductor 20. The transformer action steps up the signal voltage connected across the grid-cathode circuit to a desired value dependent upon the position of the tap 33. At low frequencies the tube 10 amplifies in a conventional manner. At relatively high frequencies, the tube capacities or capacitances 16 and 17 offer low impedance, thereby permitting input signal currents to flow directly into the load resistance 19.

Figure 5:
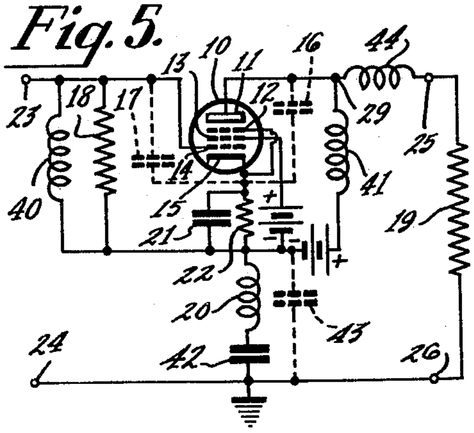

As was pointed out in connection with Figures 1, 2 and 3 the low pass amplifier stages therein illustrated could be transformed into band pass amplifiers by the conventional technique of adding parallel inductance to resonate each capacitor and a series capacitor to resonate each inductance at the frequency which is to be maximum gain. In Figure 5 of the drawing, a circuit illustrating this technique includes an inductor 40 connected in parallel with the grid-to-cathode capacitance 17, and an inductor 41 connected in parallel with the plate-to-cathode capacitance 16 to form parallel resonant circuits therewith. A capacitor 42 is serially connected with the inductor 20 to form a series resonant circuit therewith.

A pair of input terminals 23 and 24 and a pair of output terminals 25 and 26 may be provided, the terminals 25 and 26 being connected across a resistive load represented by a resistor 19. The plate 11 and the screen grid 13 are connected to a positive source of operating potential, as indicated. The suppressor grid 12 is connected to the cathode 15 in a conventional manner. A resistor 22 provides the operating bias for the pentode tube 10 and a capacitor 21 operates as a signal by-pass.

It is seen that the applied voltage is developed across a resistor 18, shunted by the inductor 40 and the grid-cathode capacitance 17 and the inductor 20 serially connected with the capacitor 42. At frequencies below the resonant frequency of the tuned circuits, the inductors 40, 41 and 44 offer substantially no impedance to the flow of signal currents which passes directly the resistive load 19. At frequencies above resonance the input signal currents flow directly through the tube interelectrode capacitances 16 and 17 to the output load resistance 19. Due to the aforementioned resonant circuits a desired band of frequency is amplified by the tube 10. Frequencies, above and below resonance, however, pass through the amplifier stage without attenuation, in the manner described.

The circuits illustrated in Figures 1, 2 and 3 have shown various means for circumventing the gain bandwidth limitation imposed upon amplifiers by the parasitic capacity of the tube. In these circuits, simple lumped ideal elements have been hypothesized. In actual practice, this is not the case.

A troublesome circuit element in high frequency amplifiers is the stray capacity of the circuit to ground. It consists of the capacity to ground of the tube, the wiring, and the components. All these can be lumped as a capacity from cathode to ground.

At frequencies above the band of amplification the amplifier becomes a high pass filter. At these frequencies, the total capacity shunting the load is the stray capacity to ground per stage times the number of stages. In a multi-stage amplifier, this capacity would limit the bandwidth capabilities of the amplifiers.

Means for compensating stray capacities to ground, which becomes an important factor in multi-stage amplifiers, are also illustrated in Figure 5. A capacitor 43 illustrates the stray capacity to ground which limits the all-pass characteristics of the stage at high frequencies.

Series inductor 44 in conjunction with shunt capacity 43 forms a section of a constant "$k$" low pass filter whose impedance is equal to the load resistance 19, if the inductance value of inductor 44 is equal to the load resistance squared times the capacitive value of the stray capacity, 43.

The insertion of the inductor 44 in this circuit prevents the gradual deterioration or attenuation of frequencies above the band of frequencies to be amplified. As the number of stages in a multi-stage amplifier is increased the stray capacitance becomes increasingly more important. The insertion of the inductor 44 restricts the effect of the shunt capacity in a multiplicity of stages from being cumulative.

In the center of the band of amplification, the inductor 44 and the capacitor 43 do not affect the stage gain since the stray capacity is shunted by low impedance series resonant circuit comprised of the inductor 20 and the capacitor 42 and the inductor 44 is in series with the high impedance parallel resonant circuit comprising the inductor 41 and the interelectrode capacitor 16. The input impedance of the stage is not affected since it is determined by the grid to cathode impedance at the center of the band.

Outside the band of amplification, inductor 44 and the capacitor 43 function as elements of a lumped constant line whose impedance is equal to the resistance of load resistor 19.

The process of inserting elements to compensate for the stray capacitance of an amplifier stage is only a first order correction. The effect of the stray capacitance to ground may also be reduced by reducing the line impedance by paralleling a number of tubes in a stage.

Figure 6:
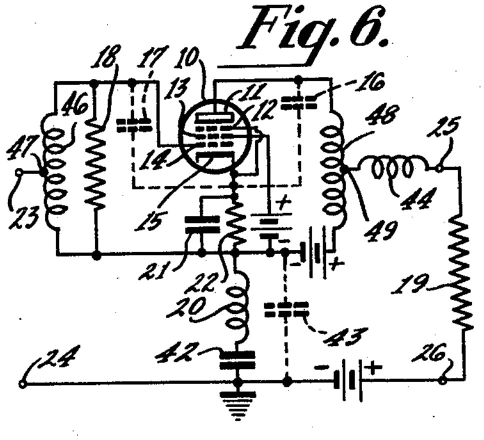

Another means for reducing the line impedance, thereby raising the high frequency limit imposed by the stray capacitance is by the use of tapped coils. In Figure 6 the inductors 40 and 41 in the output or input circuits respectively of Figure 5 have been replaced by the autotransformers 46 and 48, respectively. The use of such an auto-transformer arrangement increases the high frequency limit due to the stray capacitance by reducing the line impedance.

The operation of this circuit is substantially similar to the circuit heretofore described in connection with Figure 5, with the exception of the modifications mentioned. Input terminal 23 is connected to the tap 47 of the autotransformer in the input circuit of the tube 10. The inductor 44 is connected between a tap 49 of the autotransformer 48 and the output terminal 25.

Figures 7, 8:
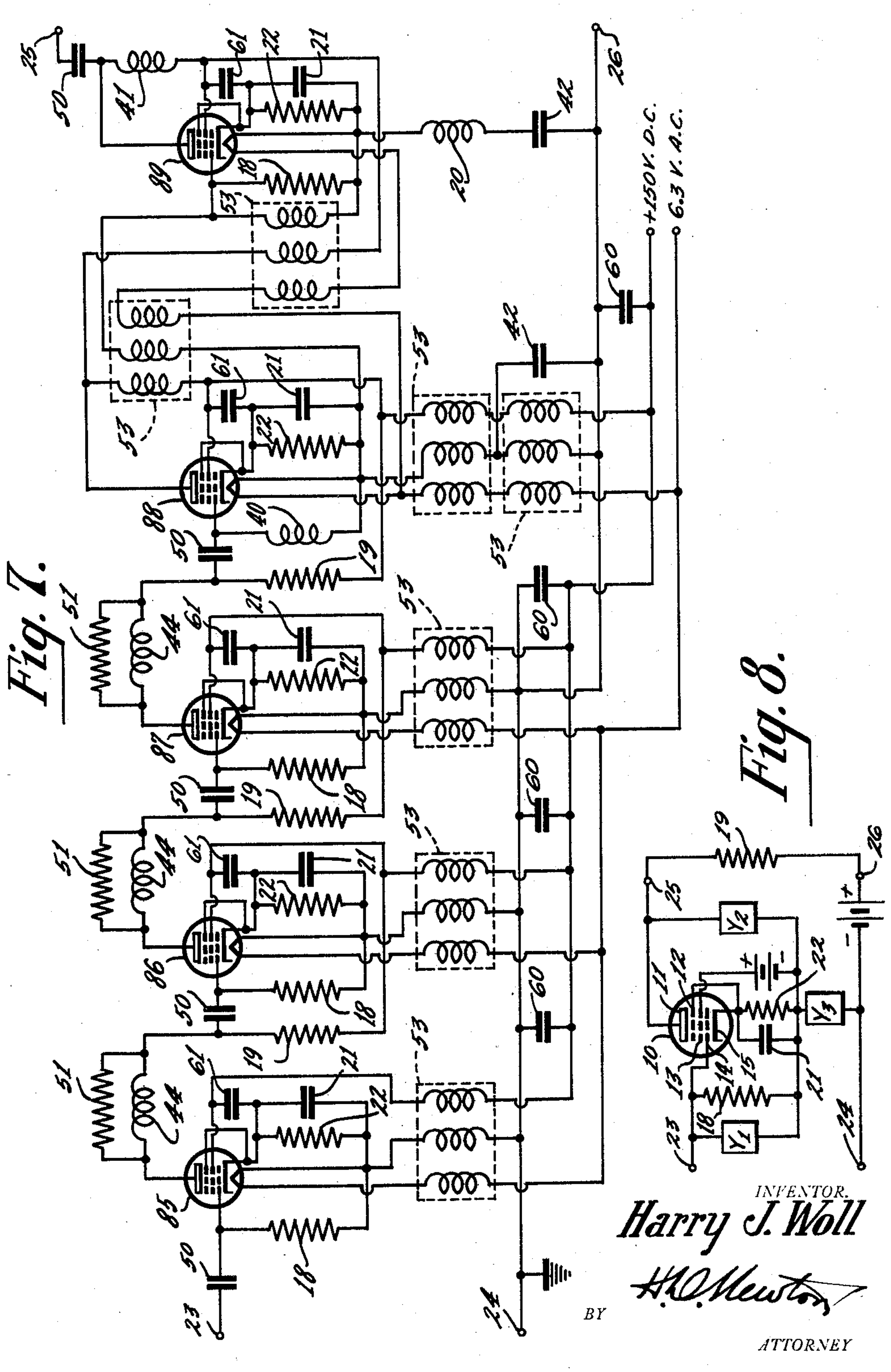
Figure 7 is a schematic circuit diagram of a multistage all-pass amplifier for high frequency signals of the order of from 10 to 70 mc.
Figure 8 is a schematic circuit diagram of an electronic tube amplifier as a further embodiment of the invention to illustrate a principle of operation.

In Figure 7, a 10 to 70 megacycle cascade-coupled amplifier comprises one electron tube amplifying stages 85, 86, 87, 88 and 89. The grid input stage described in connection with Figure 1 was chosen as basic building block. The first 3 stages are low-pass amplifiers while the fourth is a band-pass stage tuned to amplify frequencies close to 50 megacycles and the fifth is a band-pass stage tuned to amplify frequencies close to 70 megacycles. All the stages except the fourth and fifth are coupled by similar coupling capacitors 50. Grid bias for these stages is provided by respective cathode resistors 22 which are shunted by similar by-pass capacitors 21. The first three stages are provided with inductors 44 which are used to compensate for the stray capacitances of the tube to ground such as described in detail in connection with Figure 5. Respective resistors 51 act as damping resistors for the inductors 44 in the first three stages and eliminates resonant peaks in response at and above the cut-off frequency of the constant k-filter formed by the shunt capacitors and the series inductors. The plate voltages for the first three stages are coupled from the power supply to the tube with trifilar coils 53 since all the tube electrodes are at signal level and cannot be connected directly to the plate supply. Suppressor grids are connected to the cathodes.

Figure 9:
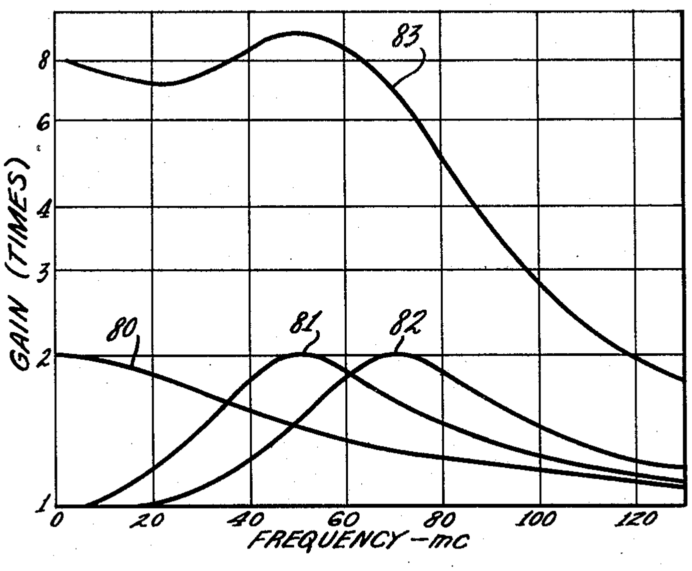
Figure 9 is a graph showing frequency response curves illustrating certain operating characteristics of the amplifier in Figure 7.

In Figure 9 the frequency response curves of various portions of the amplifier illustrated in Figure 7 are shown with respect to gain. The input circuit for the first amplifier tube 85 includes a pair of input terminals 23 and 24 which are connected across the grid-cathode circuit of this tube. This tube acts as a low-pass amplifier such as described in connection with Figure 1. The response of this first stage is illustrated by curve 80. The output signal is connected to the grid circuit of the second amplifier tube 86 which also operates as a low-pass amplifier whose response is similar to the first stage and also represented by the curve 80. The output from this second stage is connected to the grid circuit of the third amplifier tube 87 which also operates as a low-pass amplifier with a similar characteristic output curve 80.

The output from the third stage is connected to the grid of the fourth amplifier tube 88 through the coupling capacitor 50 and across the coil 40. As was pointed out, hereinbefore, this stage is tuned to amplify frequencies of approximately 50 megacycles. Inductor 40 forms a parallel resonant circuit with the grid-cathode capacitance, said capacitance not being shown in Figure 7 for the sake of clarity, but described more fully in connection with Figure 5. A capacitor 42 is connected in series with one of the trifilar windings 53 to form a series resonant circuit, such as described in connection with Figure 5. The trifilar coil 54 in the plate circuit of the amplifier tube 88 shunts the plate-cathode capacitance to form a parallel resonant circuit, also described more fully in Figure 5. The response of stage 4 is illustrated by the characteristic curve 81.

The output from the fourth stage is connected to grid circuit of the amplifier tube 89. As was pointed out, this stage is tuned to a frequency of 70 megacycles. A trifilar winding is connected in shunt with the grid-cathode capacitance and its inductance forms a resonant circuit therewith. A trifilar winding and capacitor 42 in the cathode circuit are connected in series to resonate at 70 megacycles. Another trifilar winding shunts the plate-to-cathode capacitance to form a parallel resonant circuit therewith. The output from stage 5 is coupled through the capacitor 50 across a pair of output terminals 25 and 26. The frequency response of stage 5 is illustrated by the characteristic curve 82.

The overall response of the amplifier is illustrated by the curve 83. It is seen that frequencies outside the band of amplification are transmitted without attenuation.

It should be noted that compensating coils 44 used in the first three stages were not used in the fourth and fifth stages. Since these tubes are operating as amplifiers at higher frequencies, their cathode to ground impedances are low at these frequencies and therefore the shunt capacity has only a slight effect. Operating potentials are supplied from a terminal indicated 150 v. D.C. The heater voltages are supplied from a terminal marked 6.3 v. A.C. Capacitors 60 are filter capacitors. Capacitors 61 are screen by-pass capacitors.

In most practical applications of a tuned amplifier, the simplest form of response curve and perhaps the most useful is the single-peaked curve. Although most of the foregoing discussion is centered around this type of curve and the means of producing generalized responses by staggering a multiplicity of such stages, one is not limited to such means. Even if a constant input impedance is maintained, freedom in the choice of stage response curves exists.

In Figure 8 of the drawing, a grid-input all-pass amplifier stage, partially in block diagram form, includes a pentode 10 having an anode 11, cathode 15 and three control electrodes, 12, 13, and 14.

$Y_1$ and $Y_2$ are admittances which include the input and output capacities, respectively, of the tube. However, other circuit elements may be included within these circuits, dependent upon the generalized response desired. Likewise, $Y_3$ may include elements in place of or in addition to the inductor included in the cathode circuit in Figures 1 to 6.

Of course if a certain generalized response is desired, the values contained in $Y_1$, $Y_2$ and $Y_3$ must have a definite relationship and the values must be within certain limits specified by the formulas which follow:

The input impedance is resistive at all frequencies if:

$$\frac{g_m}{G}=\frac{Y_1}{Y_2}$$

and $$Y_1Y_3=G^2+G_mG$$

The voltage transfer ratio is then:

$$\frac{E_3}{E_1}=\frac{Y_2-G}{Y_2+\frac{G^2}{g_m}}$$

where $Y_1$, $Y_2$ and $Y_3$ are the admittances of the respective elements within the blocks and G is the conductance of the resistor 19 or equal to $1/R$.

Although the circuit arrangements of the three all-pass amplifier stages, such as illustrated in Figures 1, 2 and 3 are different, the form of the response curve is the same for all.

As described herein a wide band amplifier may be favorably compared with the distributed amplifier and the divided band amplifier as a means of amplifying signals over very large band widths.

It should be realized that the circuit arrangements shown in this application are merely illustrative and that various modifications may be made without departing from the scope of this invention. It is also obvious that the precise terms of the mathematical formulas may be modified without departing from the scope of the invention.

Various circuits have been shown in which at least unity gain for each stage of amplification for all frequencies is attained. Such circuits, therefore, permit wide band-widths passage and signal amplification without the disadvantages of previous conventional amplifiers. For example, the problem of matching subbands at the cross-over points, such as exists in parallel amplifier, is avoided.

Means are also provided whereby the tube capacities, which heretofore have been very troublesome in wide-band amplifiers, are now utilized to form part of a filter network to permit passage of all frequencies within a useful band without attenuation.

What is claimed is:

1. An all-pass amplifier tuned to amplify signals within a frequency band and comprising in combination, signal input and output circuits, said output circuit including a load element, said circuits having a common point of reference potential, a transfer impedance network including an electron discharge device having stray capacitance to said point of reference potential, said electron discharge device further having at least cathode, anode, and control grid elements with interelectrode capacitance between each of said second and last named elements and the cathode element, a first inductive element connected between said grid and cathode elements providing a resonant circuit with the capacitance between said grid and cathode elements, a second inductive element connected between said anode and cathode elements providing a resonant circuit with the capacitance between said anode and cathode elements, a series resonant circuit connected between said cathode element and said point of reference potential, means for applying a signal voltage comprising a range of frequencies between said grid element and said point of reference potential, a third inductive element connected serially with said output circuit load element between said anode element and said point of reference potential, whereby voltage comprising frequencies within said frequency band are amplified by said electron discharge device and coupled to said load element and signal voltages comprising frequencies outside said band are applied without attenuation through the interelectrode capacitances and across said series resonant circuit to said load element.

2. A wide-band signal amplifier system comprising signal input and output circuits, load impedance means connected in said output circuit, a signal transfer impedance network connected between said input and output circuits and including an electron discharge amplifying tube having an anode, a cathode element and a control grid element with interelectrodal capacitances therebetween, an inductive circuit element connected between one of said tube elements and a point of fixed reference potential for said system, means for applying wide-band signal voltages between the other of said tube elements and said point of reference potential, means connecting said load impedance means said anode and said point of reference potential, an inductive tuning element connected in parallel with each of the interelectrodal capacitances between the grid and cathode elements and between the cathode element and the anode to provide resonant circuits therewith, and a capacitance element connected serially with said first-named inductive circuit element to provide a resonant circuit therewith, whereby signal voltages of frequencies to which said circuits are resonant are amplified and applied to said load impedance means and other signal voltages are passed from said input circuit to said output circuit and applied to said load impedance means substantially without attenuation.

3. An all-pass amplifier tuned to amplify signals in a frequency band and comprising in combination, signal input and output circuits, said output circuit including load impedance means, a signal-transfer impedance network connected between said input and output circuits and including an electron discharge amplifier device, said circuits and network having a point of common reference potential, said amplifier device having at least cathode, anode, and control grid elements with interelectrodal capacitances between said elements, said interelectrodal capacitances having relatively low impedance to signal currents outside said frequency band, said signal-transfer network further including an inductive element connected between the grid element and said point of reference potential, means for applying signal voltages within a relatively wide range of frequencies between the cathode element and said point of reference potential, a signal bypass capacitor, and a signal output transformer in said input circuit having a primary winding connected through said capacitor between said anode and grid elements and a secondary winding connected through said capacitor and said load impedance means between said grid and point of reference potential, said interelectrodal capacitances and inductive element providing impedance values in said network whereby signal voltages in said frequency band are amplified by said electron discharge device and coupled to the load impedance means through said transformer, and signal voltages at relatively higher frequencies outside said band are transferred and applied across said inductive element directly to said load impedance means through said bypass capacitor and said interelectrodal capacitances.

4. An all-pass signal amplifier tuned to amplify signals within a frequency band and comprising in combination, a resistive signal input circuit, a resistive signal output circuit, said circuits having a common point of reference potential and said output circuit including resistive load means, a transfer impedance network including an electron discharge device having at least cathode, anode, and control grid elements with interelectrode capacitance between each of said second and last named elements and the cathode element, a first inductive element connected between said grid and cathode elements providing a resonant circuit with the capacitance between said grid and cathode elements, a second inductive element connected between said anode and cathode elements providing a resonant circuit with the capacitance between said anode and cathode elements, a series resonant circuit connected between said cathode element and said point of reference potential, means for applying a signal voltage comprising a range of frequencies between said grid element and said point of reference potential, whereby signal voltages comprising frequencies within said frequency band are amplified by said electron discharge device and coupled to the resistive load means in the ouput circuit, and signal voltages comprising frequencies outside said band are applied without attenuation through the interelectrode capacitances and across said series resonant circuit to said load means.

5. A wide-band signal amplifier system comprising signal input and output circuits, resistive load impedance means connected in said output circuit, a signal transfer impedance network for signal amplification in a frequency band connected between said input and ouput circuits and including an electron discharge amplifier tube having an anode and cathode and control grid elements with interelectrodal capacitances therebetween, said interelectrodal capacitances having relatively low impedance to signal currents at frequencies outside said frequency band, an inductive circuit element having relatively high impedance to signal currents outside said frequency band connected between one of said tube elements and a point of fixed reference potential for said system, means connected with the signal input circuit for applying wide-band signal voltages between the other of said tube elements and said point of reference potential, and means connecting the resistive load impedance means in the output circuit between said anode and said point of reference potential, whereby signals within said frequency band are amplified and applied to said load impedance means and signals outside of said frequency band are transferred and applied through said interelectrodal capacitances and across said inductive circuit element to said load impedance means substantially without attenuation.

References Cited in the file of this patent

UNITED STATES PATENTS

| | | |
|---|---|---|
| 2,068,112 | Rust | Jan. 19, 1937 |
| 2,215,796 | Rust et al. | Sept. 24, 1940 |
| 2,256,067 | Van Slooten | Sept. 16, 1941 |
| 2,351,934 | Kramolin | June 20, 1944 |
| 2,431,333 | Labin | Nov. 25, 1947 |
| 2,460,907 | Schroeder | Feb. 8, 1949 |
| 2,549,992 | Strutt et al. | Apr. 24, 1951 |

FOREIGN PATENTS

| | | |
|---|---|---|
| 534,104 | Great Britain | Feb. 27, 1941 |

UNITED STATES PATENT OFFICE
CERTIFICATE OF CORRECTION

Patent No. 2,913,539

November 17, 1959

Harry J. Woll

It is hereby certified that error appears in the printed specification of the above numbered patent requiring correction and that the said Letters Patent should read as corrected below.

Column 11, line 48, after "pass" insert -- signal --; column 12, 15, after "means" insert -- between --; line 47, strike out "input" and insert instead -- output --.

Signed and sealed this 31st day of May 1960.

(SEAL)
Attest:

KARL H. AXLINE
Attesting Officer

ROBERT C. WATSON
Commissioner of Patents